(12) United States Patent
Shin et al.

(10) Patent No.: US 12,507,401 B2
(45) Date of Patent: Dec. 23, 2025

(54) SEMICONDUCTOR DEVICE HAVING A PERPENDICULAR DISCRETE CONTACT NODE COUPLED TO THE END OF A FIRST IMPURITY HORIZONTAL LAYER

(71) Applicant: SK hynix Inc., Gyeonggi-do (KR)

(72) Inventors: Wan Sup Shin, Gyeonggi-do (KR); Seung Wook Ryu, Gyeonggi-do (KR); Kyung Bin Chun, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 466 days.

(21) Appl. No.: 18/185,372

(22) Filed: Mar. 17, 2023

(65) Prior Publication Data
US 2024/0057319 A1  Feb. 15, 2024

(30) Foreign Application Priority Data
Aug. 11, 2022  (KR) .......... 10-2022-0100766

(51) Int. Cl.
*H10B 12/00* (2023.01)
(52) U.S. Cl.
CPC ............... *H10B 12/482* (2023.02)
(58) Field of Classification Search
CPC ........ H10B 12/02; H10B 12/03; H10B 12/05; H10B 12/30; H10B 12/48; H10B 12/482; H10B 12/488; H10B 51/20; H10B 51/30; H10B 53/20; H10B 61/22; H10B 63/30; H10D 1/716; H10D 30/6755; H10D 30/6757; H10D 86/423; H10D 86/481; H10D 86/60
See application file for complete search history.

(56) References Cited

U.S. PATENT DOCUMENTS

| | | |
|---|---|---|
| 2021/0043629 A1 | 2/2021 | Kim et al. |
| 2021/0183862 A1* | 6/2021 | Son ................... H01L 21/28518 |

FOREIGN PATENT DOCUMENTS

KR  10-2022-0110983 A  8/2022

* cited by examiner

*Primary Examiner* — Hoai V Pham
(74) *Attorney, Agent, or Firm* — IP & T GROUP LLP

(57) ABSTRACT

A semiconductor device includes: a lower structure; a horizontal layer extending in a direction parallel to a surface of the lower structure over the lower structure, and including a first end and a second end; a discrete contact node coupled to the first end of the horizontal layer to extend in a direction perpendicular to the surface of the lower structure and including a first impurity; and a doped region in the horizontal layer including the first impurity which is diffused from the discrete contact node.

20 Claims, 14 Drawing Sheets

SEMICONDUCTOR DEVICE HAVING A PERPENDICULAR DISCRETE CONTACT NODE COUPLED TO THE END OF A FIRST IMPURITY HORIZONTAL LAYER

CROSS-REFERENCE TO RELATED APPLICATIONS

The present application claims priority of Korean Patent Application No. 10-2022-0100766, filed on Aug. 11, 2022, which is incorporated herein by reference in its entirety.

BACKGROUND

1. Field

Various embodiments of the present invention relate to a semiconductor device and, more particularly, to a semiconductor device of a three-dimensional structure, and a method for fabricating the same.

2. Description of the Related Art

Recently, three-dimensional semiconductor devices including memory cells that are arranged in three dimensions are being suggested.

SUMMARY

Some embodiments of the present invention are directed to a semiconductor device including highly integrated memory cells. Other embodiments of the present invention are directed to a method for fabricating the semiconductor device.

In accordance with an embodiment of the present invention, a semiconductor device includes: a lower structure; a horizontal layer extending in a direction parallel to a surface of the lower structure over the lower structure, and including a first end and a second end; a discrete contact node coupled to the first end of the horizontal layer to extend in a direction perpendicular to the surface of the lower structure and including a first impurity; and a doped region in the horizontal layer including the first impurity which is diffused from the discrete contact node.

In accordance with another embodiment of the present invention, a semiconductor device includes: a vertical conductive line extending in a first direction perpendicular to a lower structure over the lower structure; a horizontal layer extending in a second direction parallel to the lower structure and including a first end coupled to the vertical conductive line and a second end laterally confronting the first end; a discrete contact node coupled to the second end of the horizontal layer and including a first impurity; a doped region in the horizontal layer including the first impurity which is diffused from the discrete contact node; a horizontal conductive line extending in a third direction crossing the horizontal layer over the horizontal layer; and a data storage element coupled to the discrete contact node.

In accordance with another embodiment of the present invention, a method for fabricating a semiconductor device includes: forming a stack body including a semiconductor layer between dielectric layers, and sacrificial layers between the semiconductor layer and the dielectric layers; forming an opening by etching the stack body; recessing the semiconductor layer and the sacrificial layers laterally from the opening in order to form a wide opening for defining a recessed semiconductor layer and a recessed sacrificial layer; forming a discrete contact node which is doped with an impurity over the recessed semiconductor layer and the recessed sacrificial layers; and forming a doped region in the recessed semiconductor layer by diffusing the impurity from the discrete contact node. A vertical thickness of the discrete contact node is greater than a vertical thickness of the horizontal layer. The discrete contact node and the doped region contain impurities of the same conductivity type. wherein the discrete contact node includes doped polysilicon. The forming of the discrete contact node include: forming a contact layer over the recessed semiconductor layer and the recessed sacrificial layers; forming an etch stopper layer over the contact layer; and selectively etching the contact layer by using the etch stopper layer as a barrier in order to form the discrete contact node that vertically covers the recessed semiconductor layer and the recessed sacrificial layers. The forming of the discrete contact node includes: forming a contact layer over the recessed semiconductor layer and the recessed sacrificial layers; and selectively etching the contact layer in order to form the discrete contact node of a shaving structure including rounded sidewalls. The forming of the discrete contact node includes: growing a contact layer over the recessed semiconductor layer through a selective epitaxial growth process, and wherein the discrete contact node has a ball structure. The method further comprising, after the forming of the doped region: forming an ohmic contact layer over the discrete contact node; and forming a capacitor disposed in the wide opening over the ohmic contact layer. The method further comprising, before the forming of the opening: forming a vertical opening by etching the stack body; replacing the sacrificial layers with horizontal conductive lines through the vertical opening; forming a shared contact node within the vertical opening; and forming a vertical conductive line filling the vertical opening over the shared contact node.

In accordance with another embodiment of the present invention, a semiconductor device includes: a bit line extending over a lower structure in a first direction perpendicular to the lower structure; a horizontal layer extending in a second direction parallel to the lower structure and including a first end coupled to the bit line and a second end laterally confronting the first end; a discrete contact node coupled to the second end of the horizontal layer and including a first impurity; source/drain regions in the horizontal layer including the first impurity which is diffused from the discrete contact node; a word line extending over the horizontal layer in a third direction crossing the horizontal layer; and a capacitor coupled to the discrete contact node.

In accordance with another embodiment of the present invention, a semiconductor device includes: a bit line extending over a lower structure in a first direction perpendicular to the lower structure; a first semiconductor layer extending in a second direction parallel to the lower structure and including a first end coupled to the bit line and a second end laterally confronting the first end; a second semiconductor layer coupled to the second end of the first semiconductor layer and including a first impurity; a doped region in the first semiconductor layer including the first impurity which is diffused from the second semiconductor layer; a word line extending in a third direction crossing the first semiconductor layer over the first semiconductor layer; and a capacitor coupled to the second semiconductor layer, wherein a vertical thickness of the second semiconductor layer is greater than a vertical thickness of the first semiconductor layer.

These and other features and advantages of the present invention will become apparent to the skilled person from the following detailed description and drawings.

DETAILED DESCRIPTION

Figure 1A:
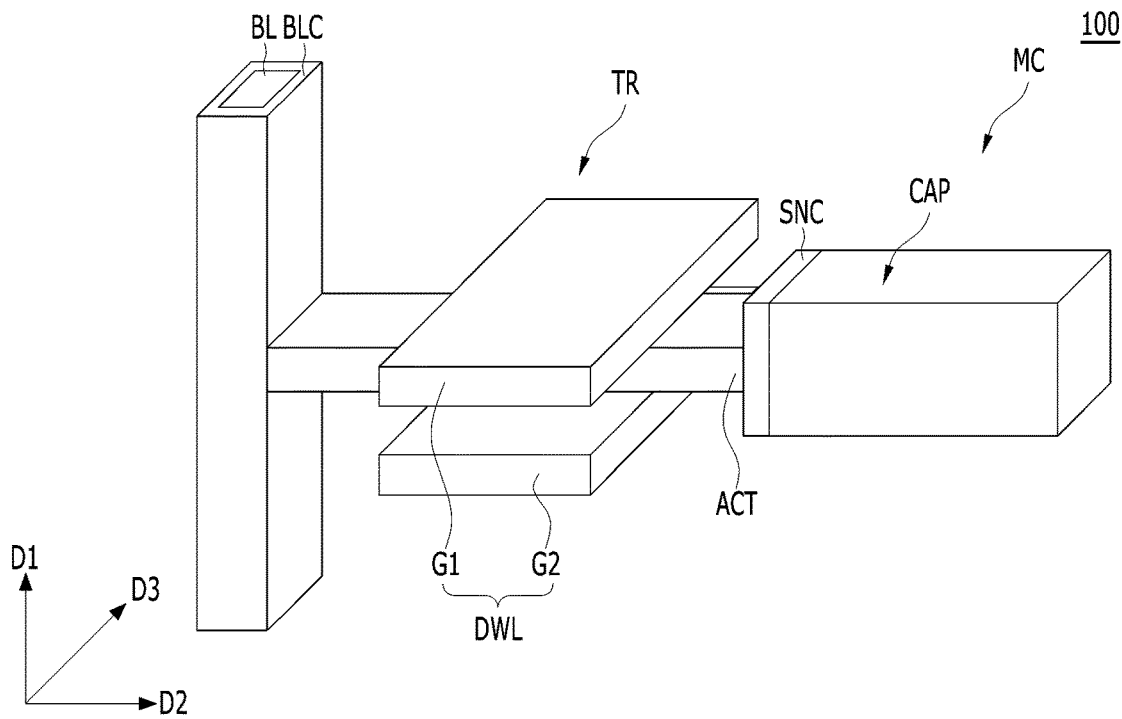
FIG. 1A is a simplified schematic perspective illustration of a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The following embodiments of the present invention described below suggest a structure and method for doping an impurity through lateral diffusion in a semiconductor device having a three-dimensional structure. The embodiments described below relate to a lateral diffusion doping technique for forming a doped region, such as a source/drain in a semiconductor device having a three-dimensional structure.

With a general implantation doping technique, it is difficult to perform uniform doping and doping at a low impurity concentration in a semiconductor device having a three-dimensional structure.

Figure 1B:
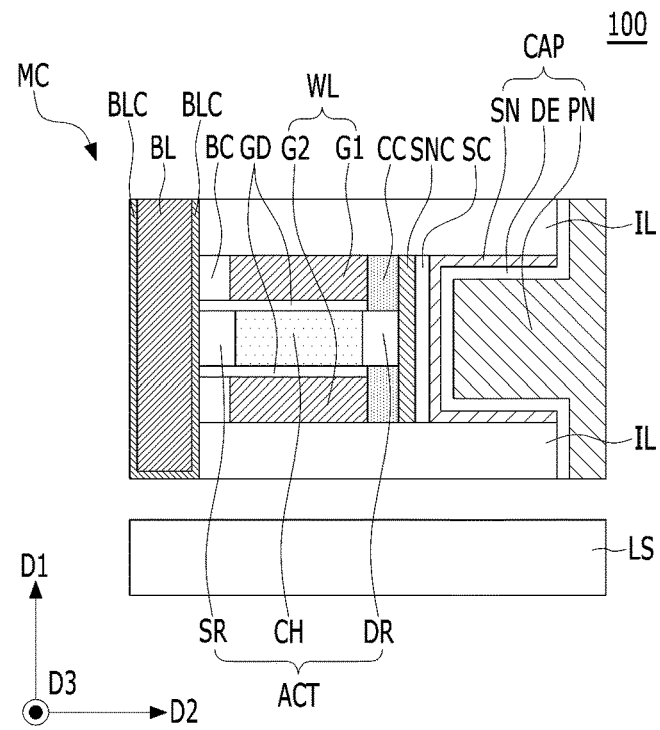
FIG. 1B is a simplified schematic cross-sectional illustration of the semiconductor device of FIG. 1A in accordance with an embodiment of the present invention.
Figure 2:
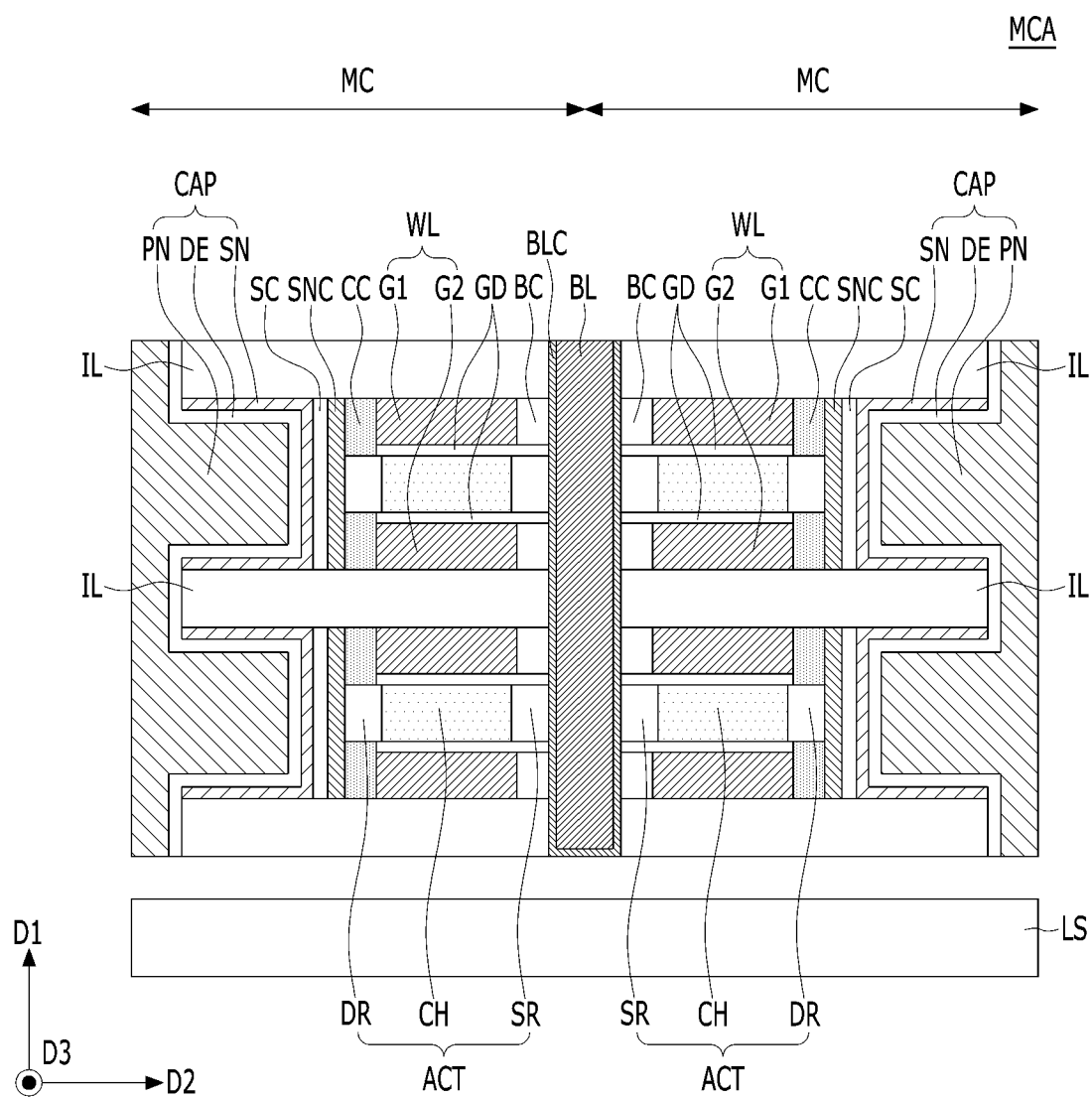
FIG. 2 is a cross-sectional illustration of a memory cell array MCA.

FIG. 1A is a simplified schematic perspective illustration of a semiconductor device in accordance with an embodiment of the present invention. FIG. 1B is a simplified schematic cross-sectional illustration of the semiconductor device. FIG. 2 is a cross-sectional illustration of a memory cell array MCA. FIG. 2 illustrates a three-dimensional array of memory cells MC shown in FIG. 1B.

Referring to FIGS. 1A and 1B, a semiconductor device 100 in accordance with the embodiment of the present invention may include a lower structure LS and memory cells MC. Referring to FIG. 2, the memory cell array MCA may include a three-dimensional array of memory cells MC. The memory cell array MCA may be disposed over the lower structure LS. The memory cell array MCA may include a plurality of memory cells MC.

The memory cell MC and the memory cell array MCA will be described with reference to FIGS. 1A, 1B, and 2.

Each memory cell MC may include a vertical conductive line BL, a switching element TR, and a data storage element CAP. The switching element TR may include a horizontal layer ACT and a horizontal conductive line WL. The vertical conductive line BL may include a bit line, and the horizontal conductive line WL may include a word line. The data storage element CAP may include a memory element, such as a capacitor. The switching element TR may also be referred to as a selection element or an access element. The switching element TR may include a transistor.

The memory cell MC may include a vertical conductive line BL, a switching element TR, and a data storage element CAP. The switching element TR and the data storage element CAP may be disposed between the cell isolation layers IL. The switching element TR may include a horizontal layer ACT and a horizontal conductive line WL. The horizontal conductive line WL may have a double line structure. For example, the horizontal conductive line WL may include first and second horizontal lines G1 and G2 facing each other with the horizontal layer ACT interposed therebetween. The data storage element CAP may include a first electrode SN, a dielectric layer DE, and a second electrode PN.

The vertical conductive line BL may have a pillar shape extending in a first direction D1. The horizontal layer ACT may have a bar shape extending in a second direction D2 intersecting with the first direction D1. The horizontal conductive line WL may have a line shape extending in a third direction D3 intersecting with the first and second directions D1 and D2.

The vertical conductive line BL may be vertically oriented in the first direction D1. The vertical conductive line BL may be referred to as a vertically oriented bit line or a pillar-shape bit line. The vertical conductive line BL may include a conductive material. The vertical conductive line BL may include a silicon-based material, a metal or metal-based material, or a combination thereof. The vertical conductive line BL may include polysilicon, a metal, a metal nitride, a metal silicide, or a combination thereof. The vertical conductive line BL may include polysilicon, titanium nitride, tungsten, or a combination thereof. For example, the vertical conductive line BL may include polysilicon or titanium nitride (TiN) which is doped with an N-type impurity. The vertical conductive line BL may include a TiN/W stack which includes titanium nitride and tungsten over the titanium nitride.

The horizontal conductive line WL may extend in the third direction D3, and the horizontal layer ACT may extend in the second direction D2. The horizontal layer ACT may be arranged laterally in the second direction D2 from the vertical conductive line BL. The horizontal conductive line WL may include a pair of horizontal lines, that is, first and second horizontal lines G1 and G2. The first and second horizontal lines G1 and G2 may face each other in the first direction D1 with the horizontal layer ACT interposed therebetween. A gate dielectric layer GD may be formed on the top surface and the bottom surface of the horizontal layer ACT. The first and second horizontal lines G1 and G2 may be referred to as first and second gate lines, respectively.

The horizontal layer ACT may be referred to as an active layer or an active region. The horizontal layer ACT may include a semiconductor material or an oxide semiconductor material. For example, the horizontal layer ACT may include monocrystalline silicon, polysilicon, germanium, silicon-germanium, or indium gallium zinc oxide (IGZO). The horizontal layer ACT may include a channel CH, a first doped region SR between the channel CH and the vertical conductive line BL, and a second doped region DR between the channel CH and the data storage element CAP. The channel CH may be defined between the first and second dopped regions SR and DR. According to an embodiment of the present invention, the horizontal layer ACT may be monocrystalline silicon. The first and second dopped regions SR and DR may be referred to as first and second source/drain regions, respectively.

The first and second dopped regions SR and DR may be doped with impurities of the same conductivity type. The first and second dopped regions SR and DR may be doped with an N-type impurity or a P-type impurity. The first and second dopped regions SR and DR may include at least one impurity selected among arsenic (As), phosphorus (P), boron (B), indium (In), and a combination thereof. The first doped region SR may contact the vertical conductive line BL, and the second doped region DR may contact a first electrode SN. The switching element TR may be a cell transistor, and the switching element TR may have one horizontal conductive line WL. In the horizontal conductive line WL, the same voltage may be applied to the first and second horizontal lines G1 and G2. For example, the first and second horizontal lines G1 and G2 may form a pair, and the same driving voltage may be applied to the pair of the first and second horizontal lines G1 and G2. As described above, a memory cell MC according to the embodiment of the present invention has a horizontal conductive line WL having a double line structure in which a pair of first and second horizontal lines G1 and G2 are disposed adjacent to one channel CH.

According to an embodiment of the present invention, different voltages may be applied to the first and second horizontal lines G1 and G2. For example, a driving voltage may be applied to the first horizontal line G1, and a ground voltage may be applied to the second horizontal line G2. The second horizontal line G2 may be referred to as a back horizontal conductive line or a shield line. According to another embodiment of the present invention, a ground voltage may be applied to the first horizontal line G1, and a driving voltage may be applied to the second horizontal line G2.

The horizontal layer ACT may have a thickness which is smaller than each of the thicknesses of the first and second horizontal lines G1 and G2. For example, the vertical thickness of the horizontal layer ACT in the first direction D1 may be smaller than the vertical thickness of each of the first and second horizontal lines G1 and G2 in the first direction D1. Therefore, the thin horizontal layer ACT may be referred to as a thin-body active layer. The thin horizontal layer ACT may include the thin-body channel CH, and the thin-body channel CH may have a thickness of approximately 10 nm or less. According to another embodiment of the present invention, the channel CH may have the same vertical thickness as the vertical thicknesses of the first and second horizontal lines G1 and G2.

The gate dielectric layer GD may include, for example, silicon oxide, silicon nitride, a metal oxide, a metal oxynitride, a metal silicate, a high-k material, a ferroelectric material, an anti-ferroelectric material or a combination thereof. The gate dielectric layer GD may include $SiO_2$, $Si_3N_4$, $HfO_2$, $Al_2O_3$, $ZrO_2$, AlON, HfON, HfSiO, HfSiON, HfZrO or a combination thereof.

The horizontal conductive line WL may include a metal or metal-based material, a semiconductor material, or a combination thereof. The horizontal conductive line WL may include titanium nitride, tungsten, polysilicon, or a combination thereof. For example, the horizontal conductive line WL may include a TiN/W stack in which titanium nitride and tungsten are sequentially stacked. The horizontal conductive line WL may include an N-type work function material or a P-type work function material. The N-type work function material may have a low work function of approximately 4.5 eV or less. The P-type work function material may have a high work function of approximately 4.5 eV or more.

The data storage element CAP may be disposed laterally from the switching element TR in the second direction D2. The data storage element CAP may include a first electrode SN that extends laterally from the horizontal layer ACT in the second direction D2. The data storage element CAP may further include a second electrode PN disposed over the first electrode SN, and a dielectric layer DE between the first electrode SN and the second electrode PN. The first electrode SN, the dielectric layer DE, and the second electrode PN may be arranged laterally in the second direction D2. The first electrode SN may have a laterally oriented cylinder shape. The dielectric layer DE may conformally cover the cylindrical inner wall and the cylindrical outer wall of the first electrode SN. The second electrode PN may have a shape extending to the cylindrical inner wall and the cylindrical outer wall of the first electrode SN over the dielectric layer DE. The second electrode PN may serve as a common plate. The first electrode SN may be electrically connected to the second doped region DR.

The first electrode SN may have a three-dimensional structure, and the first electrode SN of the three-dimensional structure may have a lateral three-dimensional structure which is oriented in the second direction D2. As an example of the three-dimensional structure, the first electrode SN may have a cylinder shape. According to another embodiment of the present invention, the first electrode SN may have a pillar shape or a pylinder shape. The pylinder shape refers to a structure in which a pillar shape and a cylinder shape are merged.

The first electrode SN and the second electrode PN may include a metal, a noble metal, a metal nitride, a conductive metal oxide, a conductive noble metal oxide, a metal carbide, a metal silicide, or a combination thereof. For example, the first electrode SN and the second electrode PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack. The second electrode PN may include a combination of a metal or metal-based material and a silicon-based material. For example, the second electrode PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the first electrode SN over the titanium nitride, and titanium nitride (TiN) may serve as a second electrode PN of a data storage element CAP, and tungsten nitride may be a low-resistance material.

The dielectric layer DE may be referred to as a capacitor dielectric layer. The dielectric layer DE may include, for example, silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The dielectric layer DE may have a dielectric constant of approximately 20 or more. The dielectric layer DE may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k materials.

The dielectric layer DE may be formed of zirconium (Zr)-based oxide. The dielectric layer DE may have a stack structure including at least zirconium oxide ($ZrO_2$). The dielectric layer DE may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. According to another embodiment of the present invention, the dielectric layer DE may be formed of hafnium (Hf)-based oxide. The dielectric layer DE may have a stack structure including at least hafnium oxide ($HfO_2$). The dielectric layer DE may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap energy (which will be, hereinafter, simply referred to as bandgap) than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a greater bandgap than the high-k material. The dielectric layer DE may include, for example, silicon oxide ($SiO_2$) as a high bandgap material other than aluminum oxide ($Al_2O_3$). Since the dielectric layer DE includes a high bandgap material, leakage current may be suppressed. The high-bandgap material may be thinner than the high-k material. According to another embodiment of the present invention, the dielectric layer DE may include a laminated structure in which a high-k material and a high-bandgap material are alternately stacked. For example, it may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the dielectric layer DE may include a stack structure, a laminated structure, or a mixed structure including zirconium oxide, hafnium oxide, and aluminum oxide.

According to another embodiment of the present invention, the dielectric layer DE may include a ferroelectric material. According to yet another embodiment of the present invention, the dielectric layer DE may include an anti-ferroelectric material.

According to another embodiment of the present invention, an interface control layer may be used for improving leakage current. The interface control may be formed between the first electrode SN and the dielectric layer DE. The interface control layer may include titanium oxide ($TiO_2$), niobium oxide, or niobium nitride. The interface control layer may also be formed between the second electrode PN and the dielectric layer DE.

The data storage element CAP may include a metal-insulator-metal (MIM) capacitor. The first electrode SN and the second electrode PN may include a metal or metal-based material.

The data storage element CAP may be replaced with another data storage material. For example, the data storage material may be a phase change material, a magnetic tunnel junction (MTJ), or a variable resistance material.

A discrete contact node SNC may be formed between the second doped region DR and the first electrode SN. The discrete contact node SNC and the second doped region DR may be electrically connected. The discrete contact node SNC may have a height that fully covers the sides of the second doped region DR. Accordingly, the contact area between the first electrode SN and the second doped region DR may be increased.

The discrete contact node SNC may include a first impurity, and the second doped region DR may include a first impurity which is diffused from the discrete contact node SNC.

The discrete contact node SNC may include a semiconductor material. The discrete contact node SNC may include doped polysilicon, for example, polysilicon doped with an N-type impurity or a P-type impurity. The second doped region DR may include impurities diffused from the discrete contact node SNC, for example, an N-type impurity or a P-type impurity. A combination of the discrete contact node SNC and the second doped region DR may form a doped region which is doped with an impurity. The combination of the discrete contact node SNC and the second doped region DR may form a T-shaped doped region, for example, a doped region having a '⊢' shape or a '⊣' shape.

As described above, the first and second doped regions SR and DR may be referred to as laterally diffused source/drain regions or laterally diffused doped regions.

A first ohmic contact layer SC may be formed between the discrete contact node SNC and the first electrode SN as shown in FIG. 1B. The first ohmic contact layer SC may have a height that fully covers the sides of the discrete contact node SNC. Specifically, in the first direction D1, the height of the discrete contact node SNC and the height of the first ohmic contact layer SC may be the same.

The first ohmic contact layer SC may be formed by reacting silicon of the discrete contact node SNC with a metal. Thus, the first ohmic contact layer SC may include a metal or metal-based material. The first ohmic contact layer SC may include, for example, metal silicide.

The first ohmic contact layer SC may be formed of a metal-containing material. The second doped region DR and the horizontal layer ACT may be formed of a semiconductor-containing material.

A shared contact node BLC may be formed between the first doped region SR and the vertical conductive line BL. The shared contact node BLC and the first doped region SR may be electrically connected to each other. The shared contact node BLC may have a height that fully covers the sides of the first doped region SR. As a result, the contact area between the vertical conductive line BL and the first doped region SR may be increased. The shared contact node BLC may have a shape that surrounds the outer wall of the vertical conductive line BL. The vertically oriented height of the shared contact node BLC may be the same as the vertically oriented height of the vertical conductive line BL.

The shared contact node BLC may include a second impurity. The first doped region SR may also include the second impurity diffused from the shared contact node BLC. The first and second impurities may be impurities of the same conductivity type.

The shared contact node BLC may include a semiconductor material. The shared contact node BLC may include doped polysilicon, for example, polysilicon which is doped with an N-type impurity or polysilicon doped with a P-type impurity. The first doped region SR may include an impurity diffused from the shared contact node BLC, for example, an N-type impurity or a P-type impurity. A combination of the shared contact node BLC and the first doped region SR may form a doped region doped with an impurity. The combination of the shared contact node BLC and the first doped region SR may form a T-shaped doped region, for example, a doped region having a '⊢' shape or a '⊣' shape.

In some embodiments, a second ohmic contact layer may be further formed between the shared contact node BLC and the vertical conductive line BL. The second ohmic contact layer may include a metal or metal-based material, for example, a metal silicide.

A first capping layer BC may be formed between the shared contact node BLC and the horizontal conductive line WL. A second capping layer CC may be formed between the discrete contact node SNC and the horizontal conductive line WL. The second capping layer CC may be formed between the first horizontal lines G1 and the discrete contact node SNC and between the second horizontal lines G2 and the discrete contact node SNC. The first capping layer BC may be formed between the first horizontal lines G1 and the shared contact node BLC and between the second horizontal lines G2 and the shared contact node BLC.

The second capping layer CC may directly contact the second doped region DR. A gate dielectric layer GD may be disposed between the first capping layer BC and the first doped region DR.

The vertical height of the discrete contact node SNC may be greater than the vertical height of the horizontal layer ACT. Here, the vertical height refers to a height (or thickness) in the first direction D1. The vertical height of the shared contact node BLC may be greater than the vertical height of each of the horizontal layer ACT and the vertical height of the discrete contact node SNC.

The discrete contact node SNC may have a height that fully covers one side of the second capping layer CC and one side of the horizontal layer ACT.

The discrete contact node SNC may have a vertical sidewall structure and may include a first vertical side and a second vertical side. The first vertical side and the second vertical side may be parallel to each other. The first vertical side of the discrete contact node SNC may contact the second doped region DR and one side of the first capping layer CC, and the second vertical side of the discrete contact node SNC may contact the ohmic contact layer SC.

The horizontal conductive line WL and the horizontal layer ACT may be disposed between cell isolation layers IL.

Referring back to FIG. 2, the memory cell array MCA may have a mirror-type structure sharing the vertical conductive line BL. The horizontal layers ACT stacked in the first direction D1 may share the shared contact node BLC. The horizontal layers ACT stacked in the first direction D1 may not share the discrete contact node SNC. For example, each of the horizontal layers ACT that are stacked in the first direction D1 may be coupled to each discrete contact node SNC. The discrete contact nodes SNC disposed in the first direction D1 may not be coupled to each other.

According to another embodiment of the present invention, additional discrete contact nodes may be disposed between the shared contact node BLC and the horizontal layers ACT. Here, the additional discrete contact nodes may be formed of the same material as that of the discrete contact nodes SNC.

FIGS. 3 to 13 are cross-sectional views illustrating an example of a method for fabricating a semiconductor device in accordance with an embodiment of the present invention.

Figure 3:
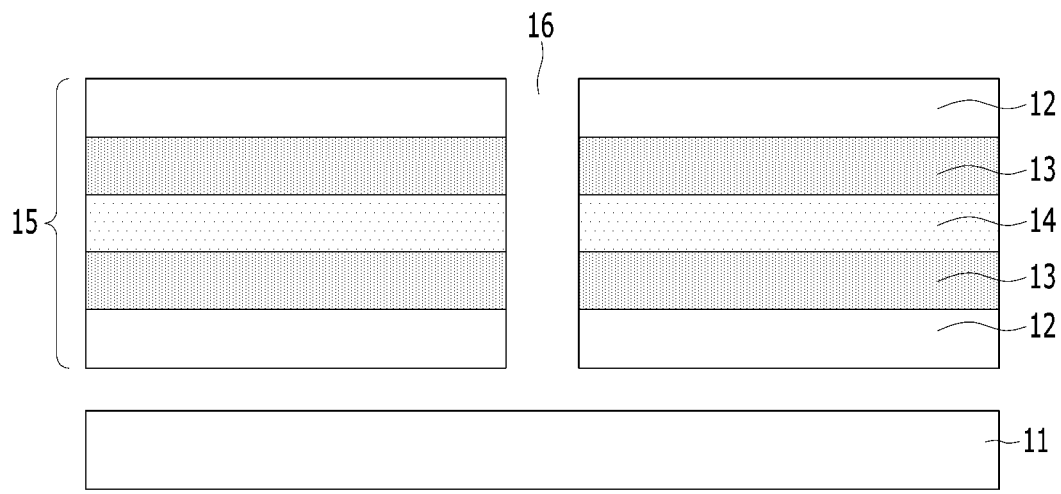
FIGS. 3 to 13 are cross-sectional views illustrating an example of a method for fabricating a semiconductor device in accordance with an embodiment of the present invention.

Referring to FIG. 3, a stack body 15 may be formed over the lower structure 11. The stack body 15 may include dielectric layers 12, sacrificial layers 13, and a semiconductor layer 14. The semiconductor layer 14 may be disposed between the dielectric layers 12, and the sacrificial layers 13 may be disposed between the dielectric layers 12 and the semiconductor layer 14. The dielectric layers 12 may include, for example, silicon oxide, and the sacrificial layers 13 may include silicon nitride. The semiconductor layer 14 may include a semiconductor material or an oxide semiconductor material. The semiconductor layer 14 may include monocrystalline silicon, polysilicon, or IGZO.

First opening 16 may be formed by etching the stack body 15. The first opening 16 may have a hole shape that vertically passes through the stack body 15 and exposes the lower structure 11.

A plurality of semiconductor layers 14 may be formed between the sacrificial layers 13. For example, similarly to the horizontal layer ACT shown in FIG. 1B, a plurality of semiconductor layers 14 may be arranged laterally on the same plane. For example, the step of forming the plurality of the semiconductor layers 14 may include forming the stack body 15 such that the sacrificial layers 13 are disposed over the dielectric layers 12 and a flat semiconductor material layer is disposed between the sacrificial layers 13, forming a plurality of isolation holes by etching the stack body 15, and forming a plurality of semiconductor layers 14 that are arranged laterally between the sacrificial layers 13 by recess-etching the flat semiconductor material layer through the isolation holes.

Figure 4:
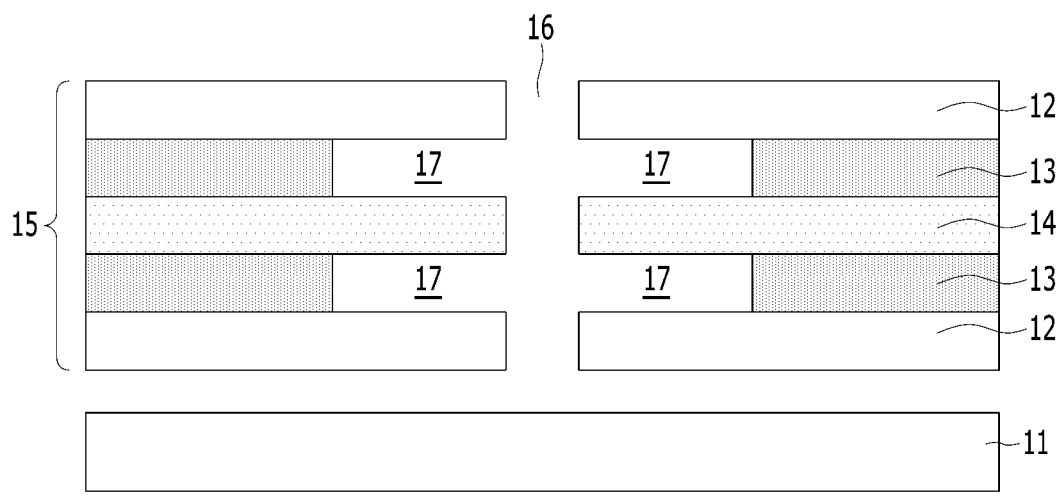

Referring to FIG. 4, lateral recesses 17 may be formed by selectively etching the sacrificial layers 13. A portion of the semiconductor layer 14 may be exposed by the lateral recesses 17. The lateral recesses 17 may be referred to as word line recesses or gate recesses.

Figure 5:
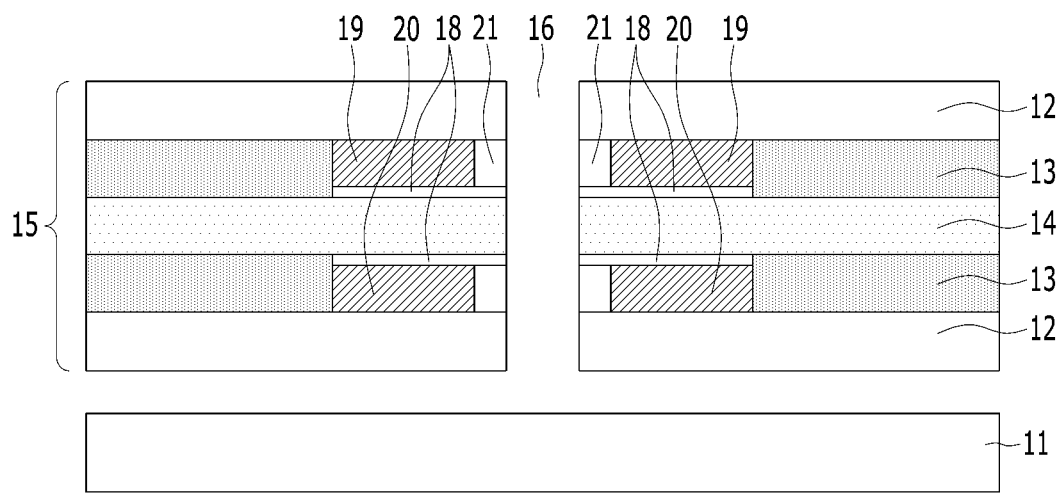

Referring to FIG. 5, a gate dielectric layer 18 may be formed over the exposed portion of the semiconductor layer 14. The gate dielectric layer 18 may be selectively formed over the exposed portion of the semiconductor layer 14 by an oxidation process. According to another embodiment of the present invention, the gate dielectric layer 18 may be formed by a deposition process. The gate dielectric layer 18 may be formed over the exposed portion of the semiconductor layer 14 which is exposed through the lateral recesses 17. The gate dielectric layer 18 may include, for example, silicon oxide.

Subsequently, a double word line structure, which includes first and second word lines 19 and 20, may be formed by filling each of the lateral recesses 17 with a conductive material. Each of the first and second word lines 19 and 20 may include polysilicon, titanium nitride, tungsten, or a combination thereof. For example, a process of forming the first and second word lines 19 and 20 may include first conformally depositing titanium nitride, and then depositing tungsten on the titanium nitride to fill the lateral recesses 17, followed by performing an etch-back process on the titanium nitride and tungsten. The first and second word lines 19 and 20 may partially fill the lateral recesses 17. As a result, a portion of the gate dielectric layer 18 may be exposed. The first and second word lines 19 and 20 may vertically face each other with the semiconductor layer 14 interposed therebetween.

Subsequently, first capping layers 21 in contact with first sides of the first and second word lines 19 and 20 may be formed. The first capping layers 21 may be disposed in the lateral recesses 17. The first capping layers 21 may include, for example, silicon oxide, silicon nitride, or a combination thereof. A portion of the gate dielectric layer 18 may be removed while the first capping layers 21 are formed. As a result, the end portion of a first side of the semiconductor layer 14 may be exposed.

Figure 6:
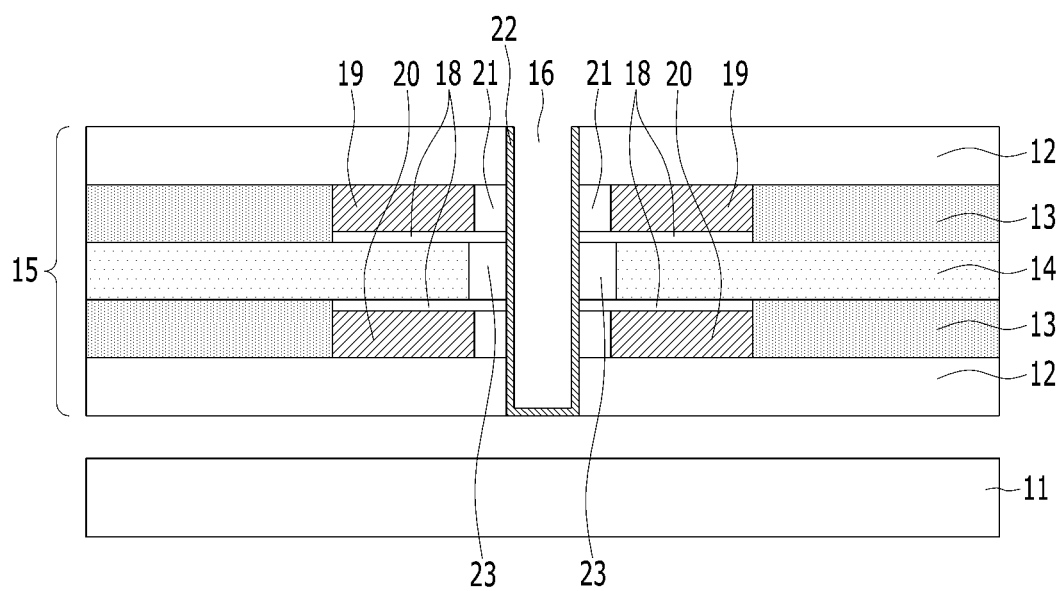

Referring to FIG. 6, a shared contact node 22 including an impurity may be formed. The shared contact node 22 may include a semiconductor material, for example, doped polysilicon. The shared contact node 22 may include polysilicon including an N-type impurity or a P-type impurity. The shared contact node 22 may be polysilicon including an N-type impurity, such as phosphorous (P). The shared contact node 22 may be formed by sequentially performing the processes of depositing a first contact layer including an impurity and etching the first contact layer. The first contact layer may include polysilicon which is doped with an N-type impurity. The shared contact node 22 may contact an end portion of the first side of the semiconductor layer 14. The shared contact node 22 may extend vertically to cover a sidewall of the first opening 16.

Subsequently, a heat treatment may be performed to diffuse the impurity from the shared contact node 22. For example, the impurity may be diffused laterally from the shared contact node 22 to the semiconductor layer 14. Accordingly, a first doped region 23 may be formed in a first portion of the semiconductor layer 14. The first doped region 23 may include the impurity diffused from the shared contact node 22.

Figure 7:
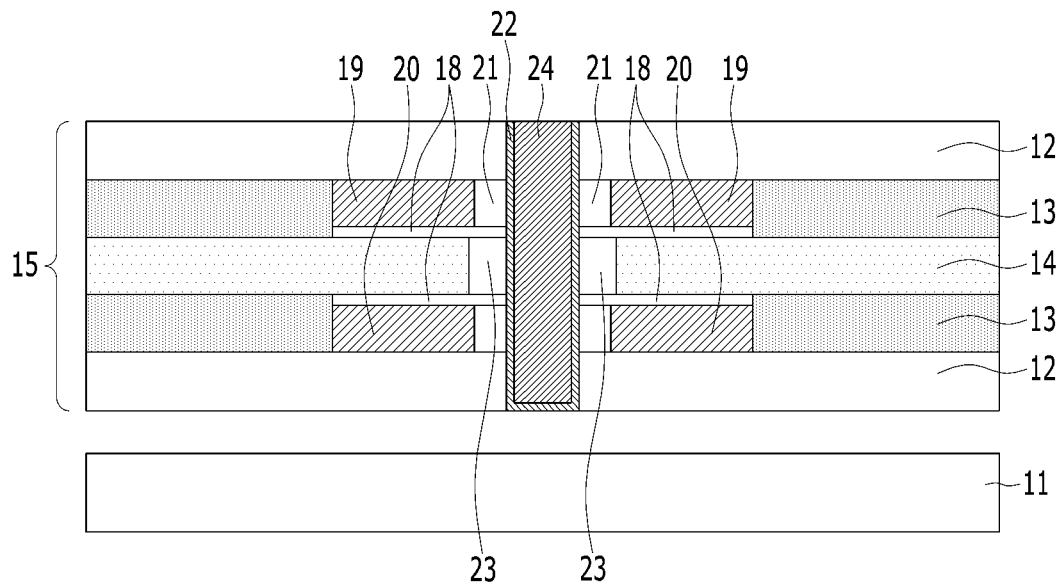

Referring to FIG. 7, a vertical conductive line 24 may be formed over the shared contact node 22 to fill the first opening 16. The vertical conductive line 24 may include a metal or metal-based material. The vertical conductive line 24 may include a metal, a metal nitride, a metal silicide, or a combination thereof. The vertical conductive line 24 may include titanium nitride, tungsten, or a combination thereof. The vertical conductive line 24 may include a bit line.

Figure 8:
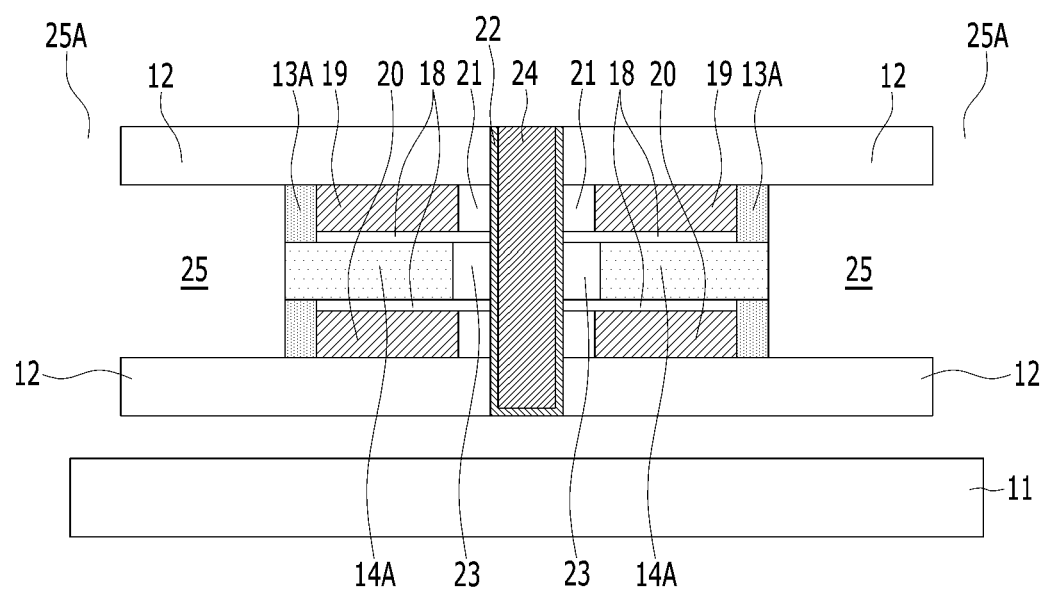

Referring to FIG. 8, second openings 25A may be formed by etching another portion of the stack body 15. The second openings 25A may extend vertically. The second openings 25A may have a hole shape passing through another portions of the stack body 15 to expose the lower structure 11. The second openings 25A may be spaced apart from each other with the vertically conductive line 24 disposed centrally at an equal distance from each of the second openings 25A.

Subsequently, the sacrificial layers 13 and the semiconductor layer 14 may be selectively recessed through the second openings 25A. As a result, wide openings 25 may be formed between the dielectric layers 12. Each wide opening 25 may define a recessed semiconductor layer 14A and recessed sacrificial layers 13A.

After performing the processes for forming each second opening 25A and wide opening 25, the remaining semiconductor layer 14 may become the recessed semiconductor layer 14A. The recessed semiconductor layer 14A may be referred to as a 'horizontal layer' or an 'active layer'. First and second word lines 19 and 20 may be formed with the recessed semiconductor layer 14A interposed therebetween. After forming the wide openings 25, the remaining sacrificial layers 13 may become the recessed sacrificial layers 13A. Hereinafter, the recessed sacrificial layers 13A will be simply referred to as second capping layers 13A.

Figure 9:
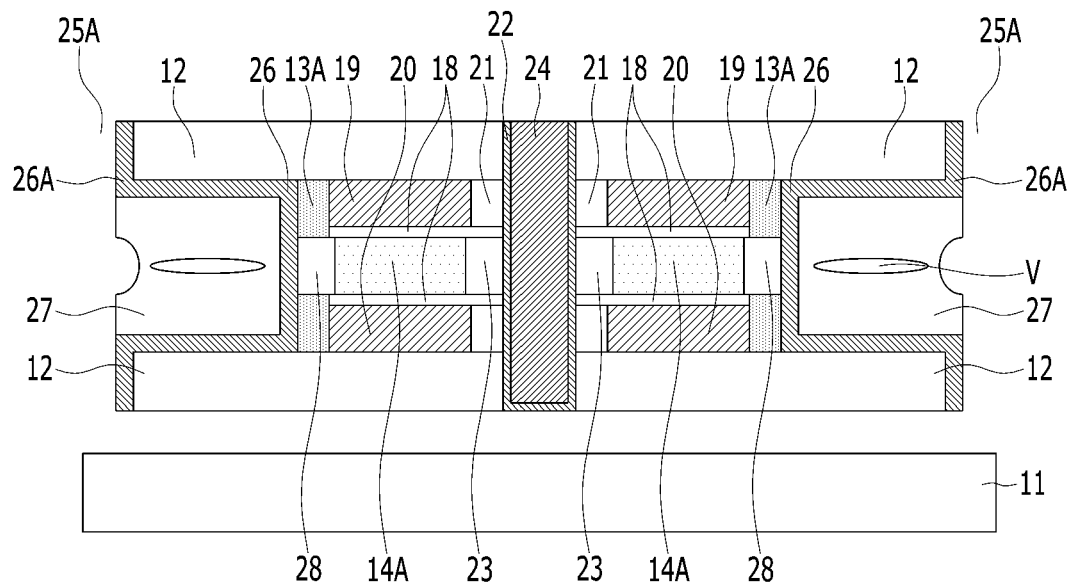

Referring to FIG. 9, a second contact layer 26A including an impurity may be formed. The second contact layer 26A may include a semiconductor material, for example, polysilicon. The second contact layer 26A may include doped polysilicon including an N-type impurity or a P-type impurity. The second contact layer 26A may be formed of polysilicon including an N-type impurity, such as phosphorous. The second contact layer 26A may contact another side of the recessed semiconductor layer 14A. The second contact layer 26A may be conformally formed on the side of the recessed semiconductor layer 14A and the sides of the second capping layers 13A. The second contact layer 26A may be formed while filling the inner portion of the wide opening 25, adjusting the concentration of the impurity.

An etch stopper layer 27 may be formed over the second contact layer 26A. The etch stopper layer 27 may have an etch selectivity with respect to the second contact layer 26A. For example, the etch stopper layer 27 may include silicon nitride. The etch stopper layer 27 may fill the wide opening 25 over the second contact layer 26A. The etch stopper layer 27 may include voids V. According to another embodiment of the present invention, the etch stopper layer 27 may include SiCN, SiCO, or a combination thereof.

Figure 10:
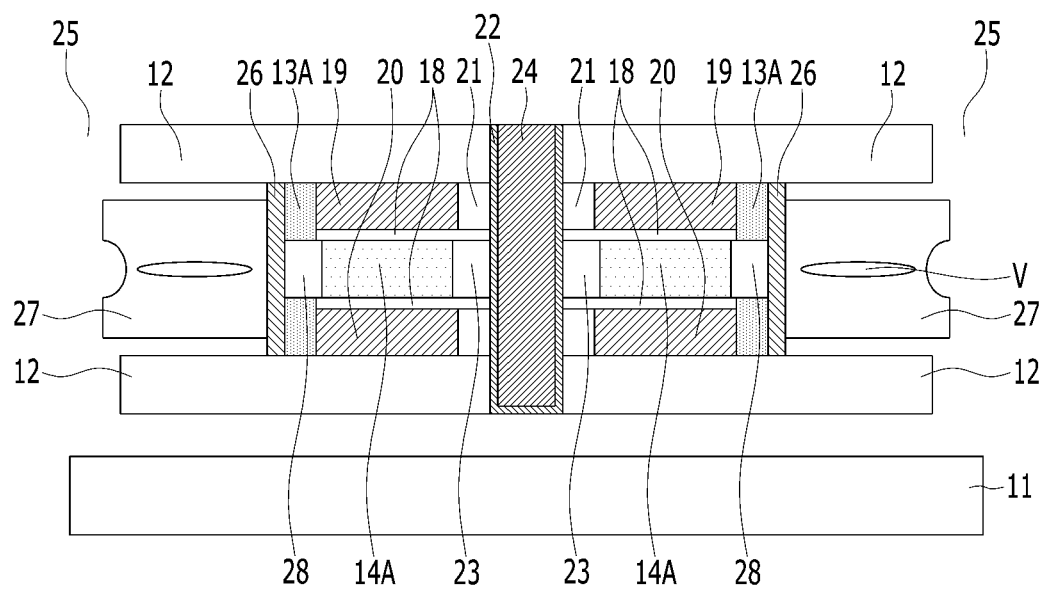

Referring to FIG. 10, a discrete contact node 26 coupled to another side of the recessed semiconductor layer 14A may be formed. In order to form the discrete contact node 26, the second contact layer 26A may be selectively etched by using the etch stopper layer 27 as a barrier. A portion of the second contact layer 26A may be selectively etched between the etch stopper layer 27 and the dielectric layers 12. Before the etching process of the second contact layer 26A, a cutting process of the etch stopper layer 27 may be performed, which may be referred to as a side cutting process.

The discrete contact node 26 may include a semiconductor material, for example, polysilicon. The discrete contact node 26 may include doped polysilicon including an N-type impurity or a P-type impurity. The discrete contact node 26 may be polysilicon including an N-type impurity, such as phosphorous.

The discrete contact node 26 may contact the end portion of a second side of the recessed semiconductor layer 14A. The discrete contact node 26 may vertically cover the end portion of the second side of the recessed semiconductor layer 14A and the second capping layers 13A.

Figure 11:
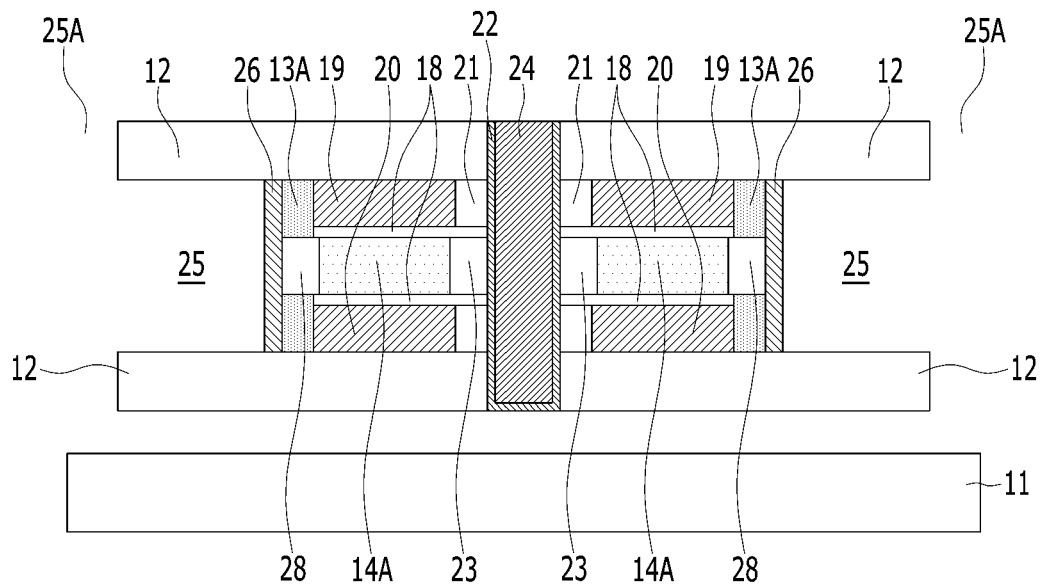

Referring to FIG. 11, the etch stopper layer 27 may be removed.

Subsequently, it is possible to diffuse the impurity from the discrete contact node 26 by performing a subsequent heat treatment. For example, the impurity may be diffused laterally from the discrete contact node 26 to the recessed semiconductor layer 14A. As a result, a second doped region 28 may be formed in a second portion of the recessed semiconductor layer 14A. The second doped region 28 may include the impurity diffused from the discrete contact node 26.

The discrete contact node 26 may be formed by the series of the processes illustrated in FIGS. 9 to 11, and the discrete contact node 26 may have an inner fill structure. The inner fill structure refers to a structure that the inner of the wide opening 25 is filled. Since the discrete contact node 26 is formed in the inner fill structure, the discrete contact node 26 may be doped with the impurity of a low concentration.

Figure 12:
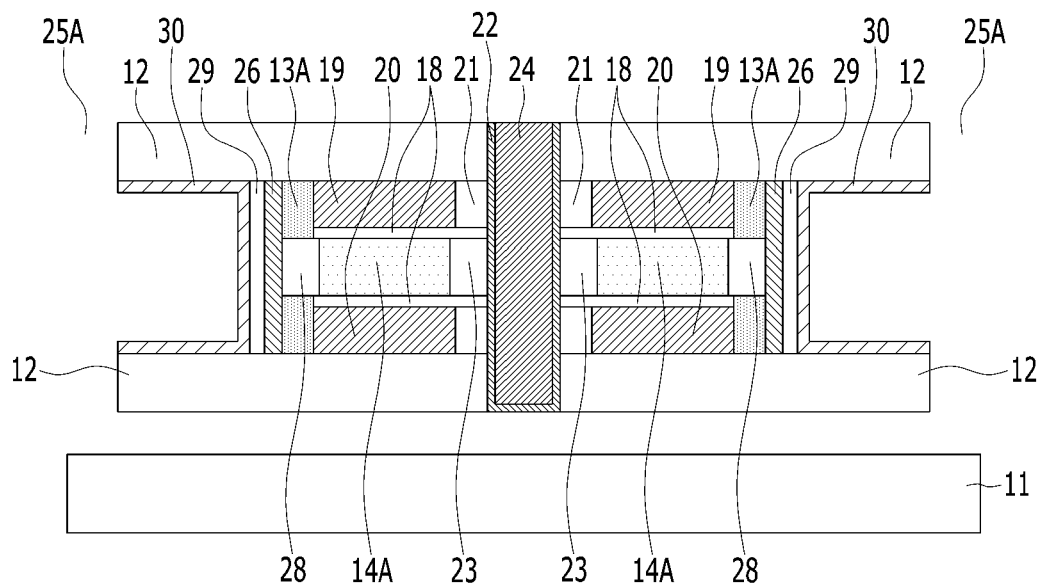

Referring to FIG. 12, an ohmic contact layer 29 may be formed over the discrete contact node 26. The ohmic contact layer 29 may be formed by sequentially depositing a metal layer, performing annealing, and removing the metal layer. The ohmic contact layer 29 may include a metal or metal-based material, for example, a metal silicide.

A first electrode 30 of the data storage element may be formed over the ohmic contact layer 29. The first electrode 30 may be formed by depositing a conductive material and performing an etch-back process. The first electrode 30 may have a laterally oriented cylindrical shape.

Figure 13:
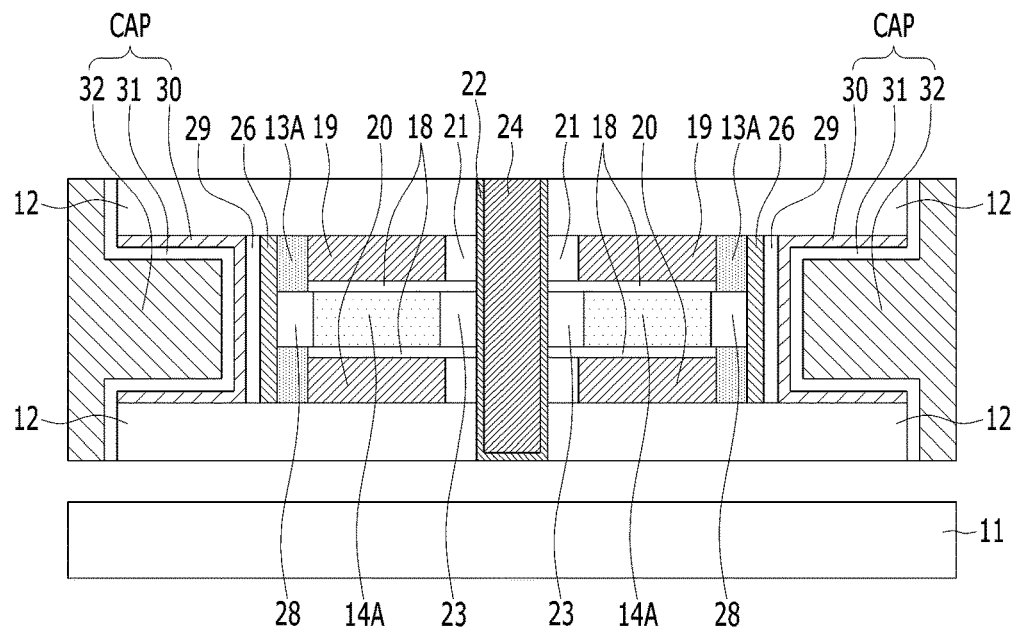

Referring to FIG. 13, a dielectric layer 31 and a second electrode 32 may be sequentially formed over the first electrode 30. The first electrode 30, the dielectric layer 31, and the second electrode 32 may form a data storage element CAP.

The first electrode 30 and the second electrode 32 may include a metal, a noble metal, a metal nitride, a conductive metal oxide, a conductive noble metal oxide, a metal carbide, a metal silicide, or a combination thereof. The first electrode 30 and the second electrode 32 may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack. The dielectric layer 31 may include, for example, silicon oxide, silicon nitride, a high-k material, or a combination thereof. The dielectric layer 31 may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer 31 may be formed of a composite layer including two or more layers of the aforementioned high-k materials. The dielectric layer 31 may include a ZA ($ZrO_2/Al_2O_3$) stack, a ZAZ ($ZrO_2/Al_2O_3/ZrO_2$) stack, a HA ($HfO_2/Al_2O_3$) stack, a HAH ($HfO_2/Al_2O_3/HfO_2$) stack, a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack.

Figure 14:
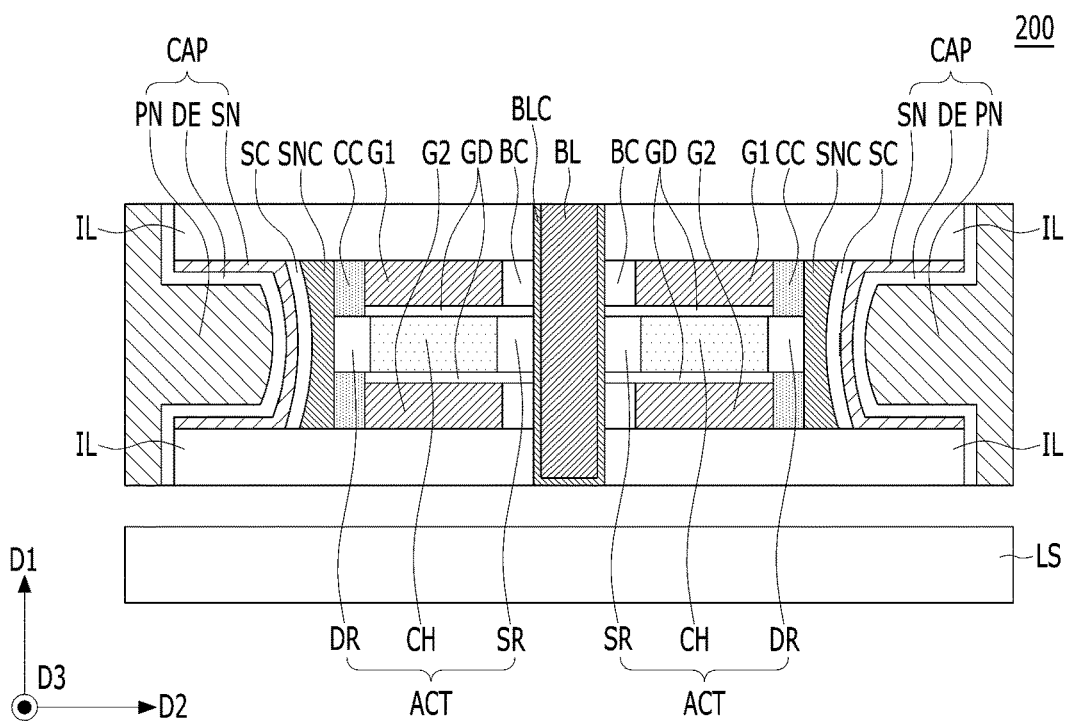
FIG. 14 is a simplified schematic cross-sectional illustration of a semiconductor device in accordance with another embodiment of the present invention.

FIG. 14 is a simplified schematic cross-sectional illustration of a semiconductor device in accordance with another embodiment of the present invention. The semiconductor device 200 shown in FIG. 14 may be similar to the memory cell array MCA of FIG. 2. Hereinafter, for detailed description on the constituent elements also appearing in FIGS. 1A to 2, description on the constituent elements of FIGS. 1A to 2 may be referred to.

Referring to FIG. 14, the semiconductor device 200 may include a vertical conductive line BL, a switching element TR, and a data storage element CAP. The switching element TR and the data storage element CAP may be disposed between cell isolation layers IL. The switching element TR may include a horizontal layer ACT, a gate dielectric layer GD, and a horizontal conductive line WL. The horizontal layer ACT may include a first doped region SR, a second doped region DR, and a channel CH between the first and second doped regions SR and DR. The data storage element CAP may include a first electrode SN, a dielectric layer DE, and a second electrode PN. The horizontal conductive line WL may include the first and second horizontal lines G1 and G2. A discrete contact node SNC may be formed between the second doped region DR and the data storage element CAP. A shared contact node BLC may be formed between the first doped region SR and the vertical conductive line BL. An ohmic contact layer SC may be formed between the discrete contact node SNC and the first electrode SN. First capping layers BC in contact with first sides of the first and second word lines G1 and G2 may be formed, and second capping layers CC in contact with second sides of the first and second word lines 19 and 20 may be formed.

The discrete contact node SNC of the semiconductor device 200 shown in FIG. 14 may have a shaving structure. The discrete contact node SNC may include a rounded side, and the rounded side may contact the ohmic contact layer SC. The discrete contact node SNC may further include a vertical side, and the vertical side may contact the second doped region DR. The discrete contact node SNC may include a doped semiconductor material, for example, doped polysilicon.

The vertical height of the discrete contact node SNC may be greater than the vertical height of the horizontal layer ACT.

FIGS. 15 to 20 are cross-sectional views illustrating an example of a method for fabricating a semiconductor device in accordance with another embodiment of the present invention.

Figure 15:
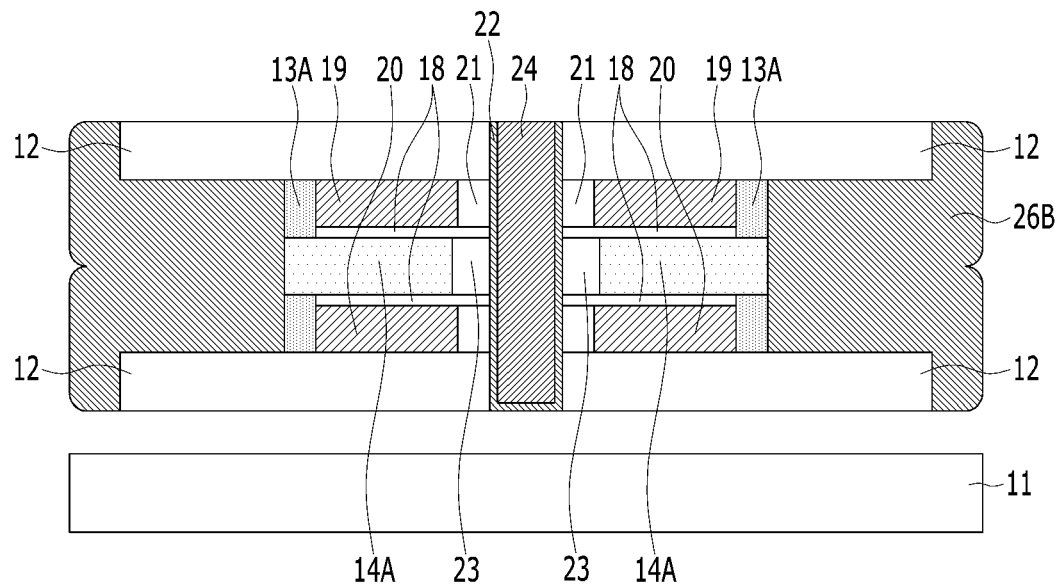
FIGS. 15 to 19 are cross-sectional views illustrating an example of a method for fabricating a semiconductor device in accordance with another embodiment of the present invention.

After a series of the processes illustrated in FIGS. 3 to 8 are performed, as shown in FIG. 15, second contact layers 26B filling the wide openings 25 may be formed. The second contact layers 26B may include a semiconductor material, for example, polysilicon. The second contact layers 26B may include doped polysilicon including an N-type impurity or a P-type impurity. The second contact layers 26B may be formed of polysilicon including an N-type impurity, such as phosphorous.

Figure 16:
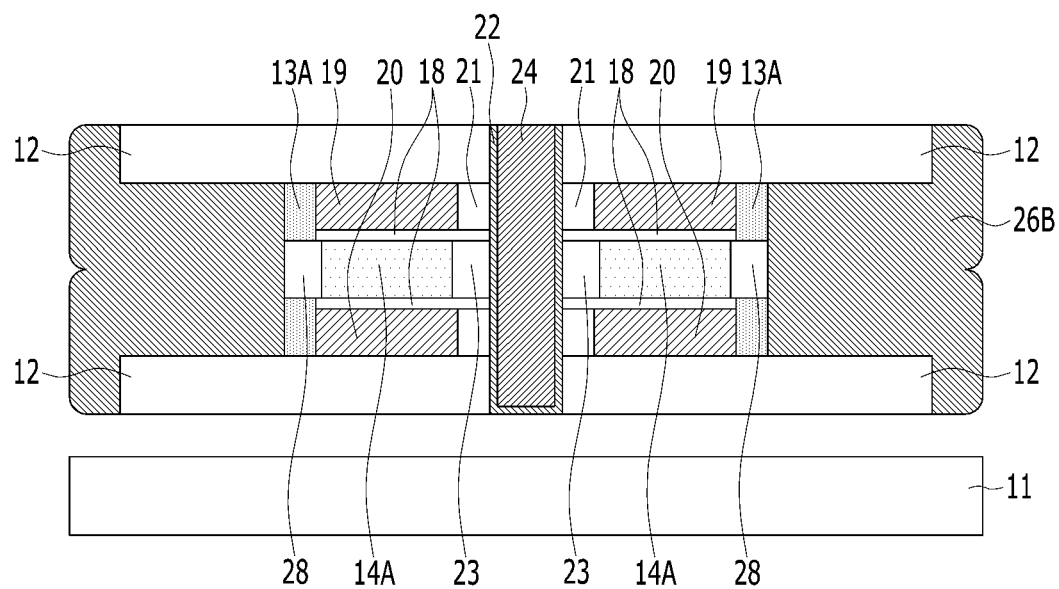

Referring to FIG. 16, the impurity may be diffused from the second contact layers 26B by performing a subsequent heat treatment. For example, the impurity may be laterally diffused from the second contact layers 26B to the recessed semiconductor layer 14A. As a result, a second doped region 28 may be formed in the second portion of the recessed semiconductor layer 14A.

Figure 17:
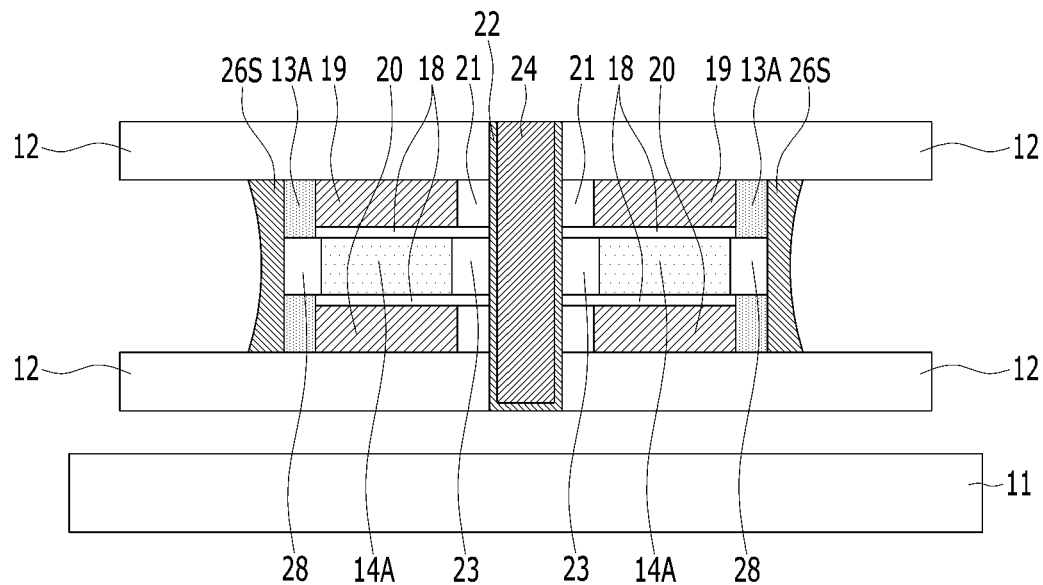

Referring to FIG. 17, a discrete contact node 26S of a shaving structure may be formed by etching each of the second contact layer 26B. The etching process of the second contact layer 26B may include a blanket etch-back process.

Figure 18:
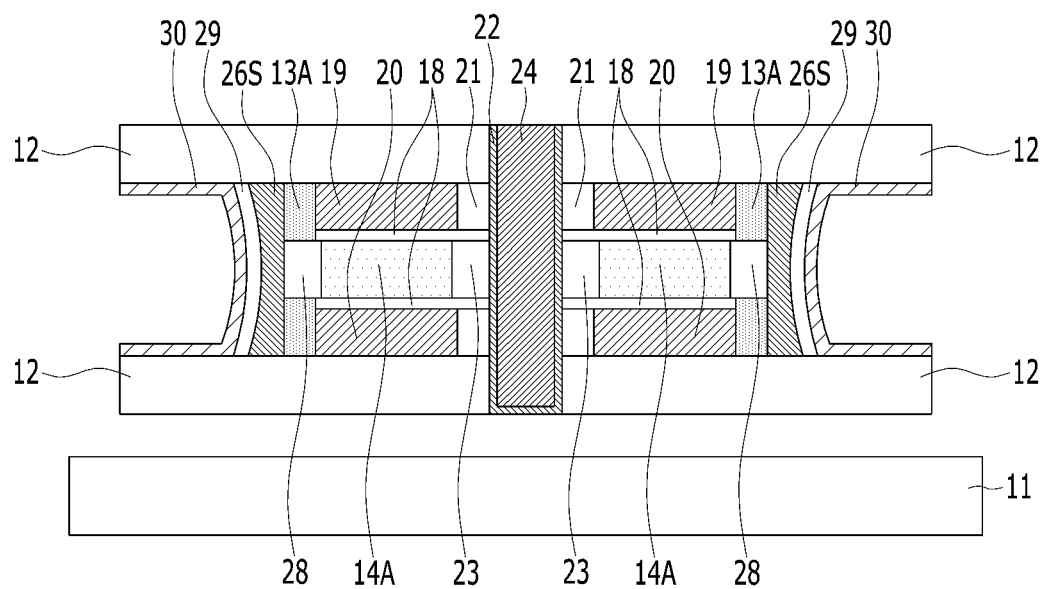

Referring to FIG. 18, an ohmic contact layer 29 may be formed over each of the discrete contact node 26S. The ohmic contact layer 29 may be formed by sequentially performing the processes of depositing a metal layer, performing an annealing process, and removing the metal layer.

The ohmic contact layer 29 may include a metal silicide. Since the discrete contact node 26S has a shaving structure, the surface area of the ohmic contact layer 29 may be increased.

First electrodes 30 of the data storage element may be formed over the ohmic contact layers 29. Each first electrode 30 may be formed by depositing a conductive material and performing an etch-back process. The first electrodes 30 may include titanium nitride. The first electrodes 30 may have a laterally oriented cylindrical shape.

Figure 19:
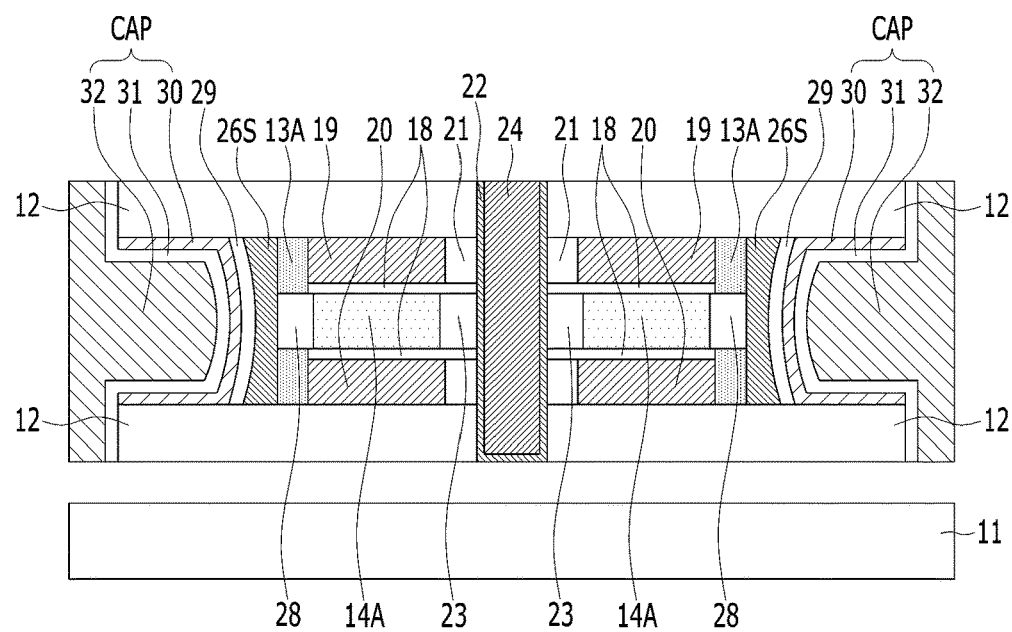

Referring to FIG. 19, a dielectric layer 31 and a second electrode 32 may be sequentially formed over the first electrode 30. The first electrode 30, the dielectric layer 31, and the second electrode 32 may form the data storage element CAP.

Figure 20:
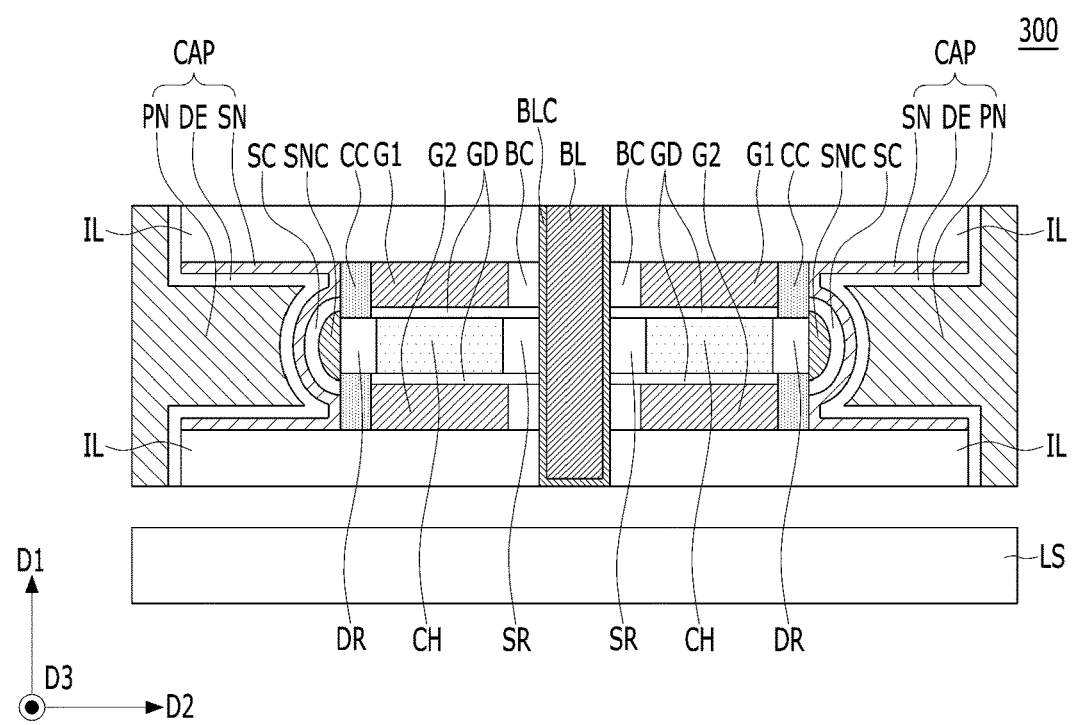
FIG. 20 is a simplified schematic cross-sectional illustration of a semiconductor device in accordance with another embodiment of the present invention.

FIG. 20 is a simplified schematic cross-sectional illustration of a semiconductor device in accordance with another embodiment of the present invention. The semiconductor device 300 shown in FIG. may be similar to the semiconductor device 100 of FIG. 1B. Hereinafter, for detailed description on the constituent elements also appearing in FIGS. 1A to 2, the description on the constituent elements of FIGS. 1A to 2 may be referred to.

Referring to FIG. 20, the semiconductor device 300 may include a vertical conductive line BL, a switching element TR, and a data storage element CAP. The switching element TR and the data storage element CAP may be disposed between cell isolation layers IL. The switching element TR may include a horizontal layer ACT, a gate dielectric layer GD, and a horizontal conductive line WL. The horizontal layer ACT may include a first doped region SR, a second doped region DR, and a channel CH between the first and second doped regions SR and DR. The data storage element CAP may include a first electrode SN, a dielectric layer DE, and a second electrode PN. The horizontal conductive line WL may include the first and second horizontal lines G1 and G2. A discrete contact node SNC may be formed between the second doped region DR and the data storage element CAP. A shared contact node BLC may be formed between the first doped region SR and the vertical conductive line BL. An ohmic contact layer SC may be formed between the discrete contact node SNC and the first electrode SN. First capping layers BC in contact with first sides of the first and second word lines G1 and G2 may be formed, and second capping layers CC in contact with second sides of the first and second word lines 19 and 20 may be formed. The first capping layers BC may be disposed between the first and second horizontal lines G1 and G2 and the shared contact node BLC, and the second capping layers CC may be disposed between the first and second horizontal lines G1 and G2 and the first electrode SN.

The discrete contact node SNC of the semiconductor device 300 shown in FIG. 20 may have a ball structure. The discrete contact node SNC may have a hemispherical structure or a convex structure. The ohmic contact layer SC may be formed over the discrete contact node SNC having a hemispherical structure. Since the ohmic contact layer SC conformally covers the hemispherical structure of the discrete contact node SNC, it may have a round shape. The first electrode SN may be formed over the ohmic contact layer SC, and since the first electrode SN covers the round shape of the ohmic contact layer SC, it may have a convex shape.

The discrete contact node SNC may be selectively grown from the second doped region DR. The discrete contact node SNC may include a doped semiconductor material, for example, an epitaxial silicon layer which is doped with an impurity. The discrete contact node SNC may be formed by a selective epitaxial growth process, which will be described later.

The vertical height of the discrete contact node SNC may be greater than the vertical height of the horizontal layer ACT.

FIGS. 21 to 24 are cross-sectional views illustrating an example of a method for fabricating a semiconductor device in accordance with another embodiment of the present invention.

Figure 21:
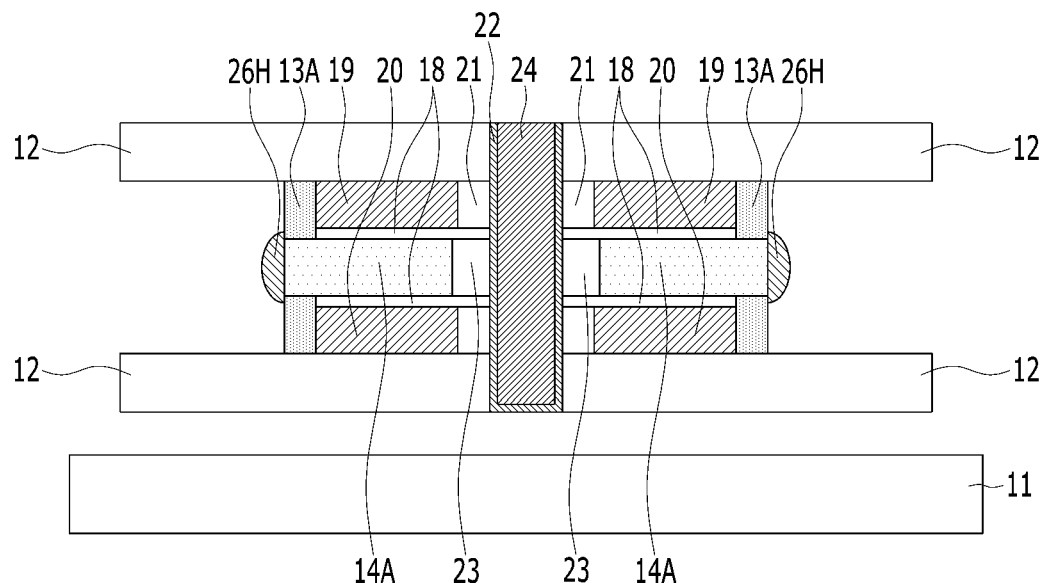
FIGS. 21 to 24 are cross-sectional views illustrating an example of a method for fabricating a semiconductor device in accordance with another embodiment of the present invention.

After a series of the processes illustrated in FIGS. 3 to 8 are performed, as shown in FIG. 21, a discrete contact node 26H may be formed on the exposed surfaces of the horizontal layer 14A. The discrete contact node 26H may include a semiconductor material, for example, doped polysilicon including an N-type impurity or a P-type impurity. The discrete contact node 26H may be polysilicon including an N-type impurity. The discrete contact node 26H may contact the second side of the recessed semiconductor layer 14A. The discrete contact node 26H may be formed by a selective epitaxial growth (SEG) process. The discrete contact node 26H may be an epitaxial silicon layer doped with an impurity. The discrete contact node 26H may have a ball structure, for example, a hemispherical structure or a convex structure. Since the discrete contact node 26H is formed by selective epitaxial growth, an etching process for forming the discrete contact node 26H may be omitted.

As described above, since the discrete contact node 26H is formed by the selective epitaxial growth (SEG), the discrete contact node 26H may be doped with an impurity at a low concentration.

Figure 22:
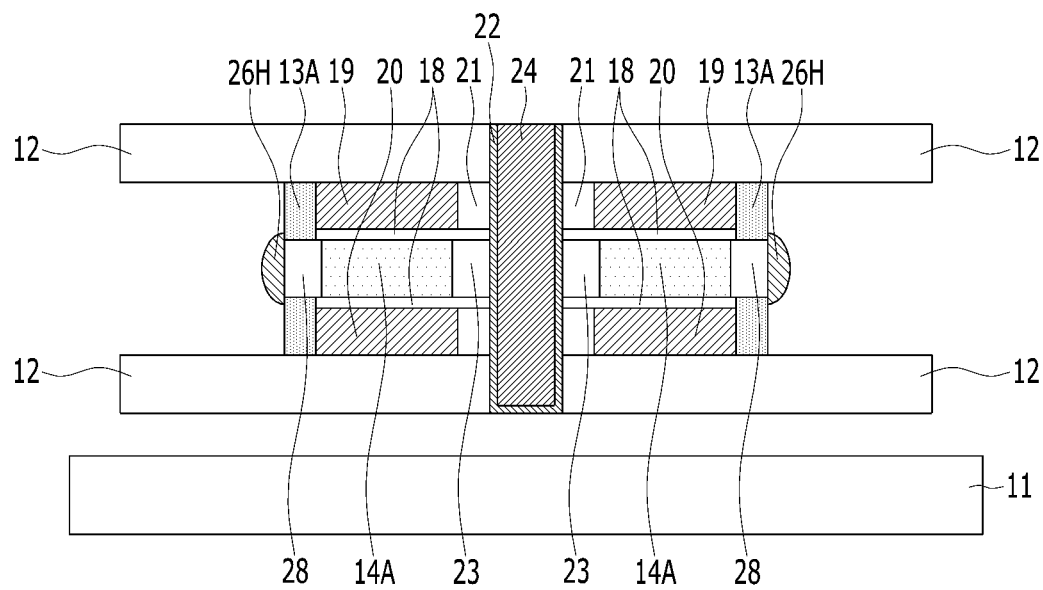

Referring to FIG. 22, it is possible to diffuse the impurity from the discrete contact node 26H by performing a subsequent heat treatment. For example, the impurity may be laterally diffused from the discrete contact node 26H to the recessed semiconductor layer 14A. As a result, a second doped region 28 may be formed in the second portion of the recessed semiconductor layer 14A.

Figure 23:
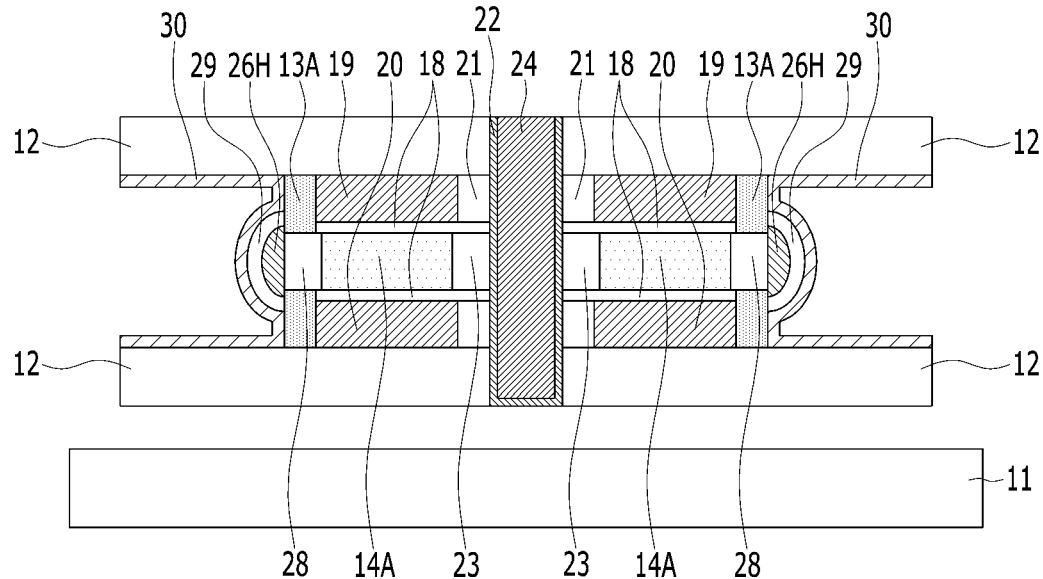

Referring to FIG. 23, an ohmic contact layer 29 may be formed over each discrete contact node 26H. The ohmic contact layer 29 may be formed by depositing a metal layer, performing an annealing process, and removing the metal layer. The ohmic contact layer 29 may include a metal silicide. Since the discrete contact node 26H has a hemispherical structure, the surface area of the ohmic contact layer 29 may be increased.

The first electrode 30 of the data storage element may be formed over the ohmic contact layer 29. The first electrode 30 may be formed by depositing a conductive material and performing an etch-back process. The first electrode 30 may include titanium nitride. The first electrode 30 may have a laterally oriented cylindrical shape.

Figure 24:
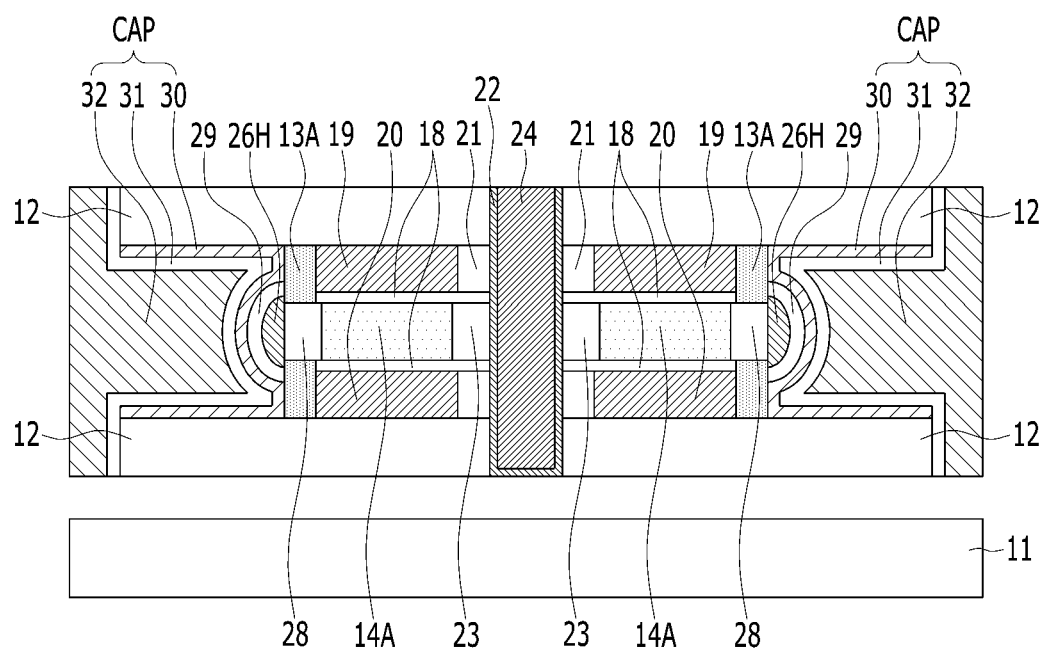

Referring to FIG. 24, a dielectric layer 31 and a second electrode 32 may be sequentially formed over the first electrode 30. The first electrode 30, the dielectric layer 31, and the second electrode 32 may form a data storage element CAP.

Figure 25:
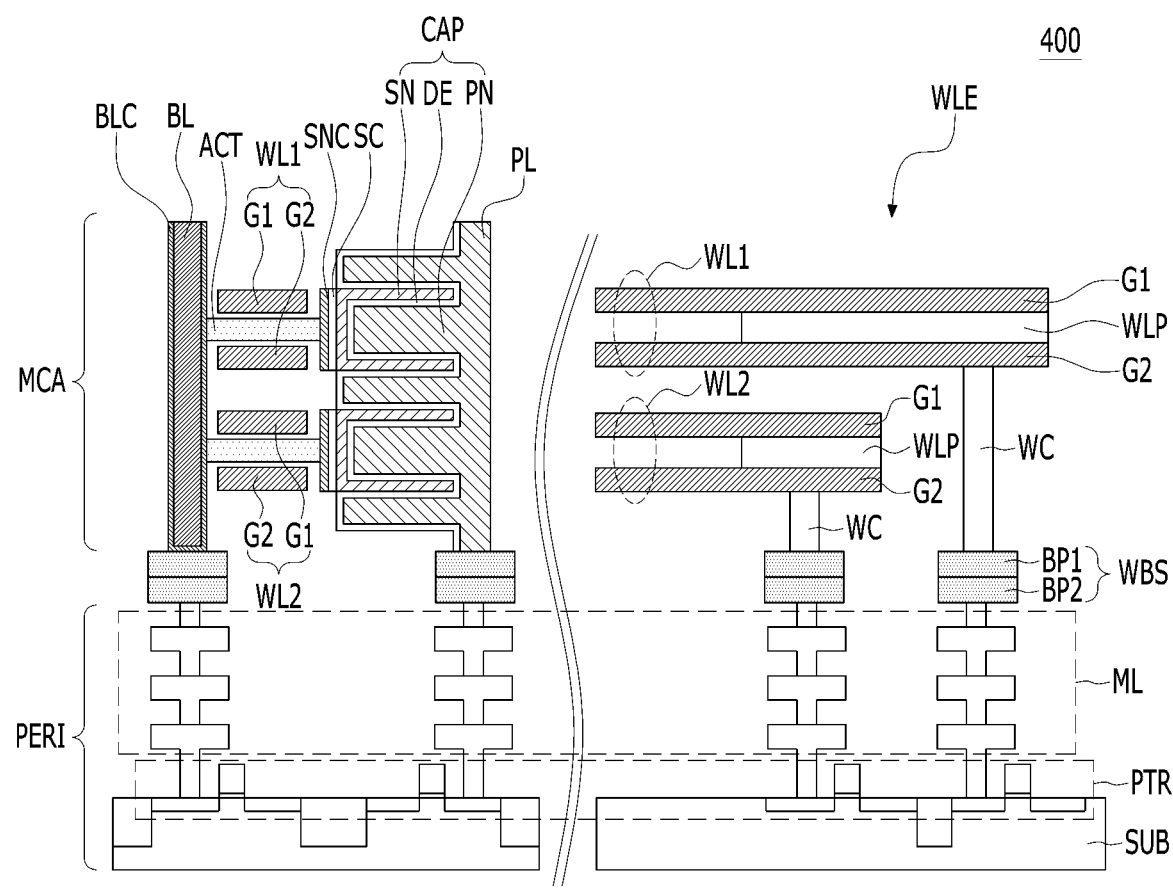
FIG. 25 is a simplified schematic cross-sectional illustration of a semiconductor device in accordance with another embodiment of the present invention.

FIG. 25 is a simplified schematic cross-sectional illustration of a semiconductor device in accordance with another embodiment of the present invention.

Referring to FIG. 25, the semiconductor device 400 may include a peripheral circuit portion PERI and a memory cell array MCA. The memory cell array MCA may be disposed over the peripheral circuit portion PERI. The memory cell array MCA and the peripheral circuit portion PERI may be coupled by wafer bonding. The semiconductor device 400 may have a COP (Cell-Over-Peripheral) structure.

The memory cell array MCA may include a three-dimensional array of memory cells. Detailed description on the memory cell array MCA and memory cells will be described with reference to FIGS. 1 to 24. For example, the memory cell array MCA may include a three-dimensional array of the memory cells MC of FIG. 1.

The memory cell array MCA may include a vertical conductive line BL, data storage elements CAP, and horizontal conductive lines WL1 and WL2. Each of the horizontal conductive lines WL1 and WL2 may have a double line structure including the first and second horizontal lines G1 and G2. A horizontal layer ACT may be disposed between the first and second horizontal lines G1 and G2. A first side of the horizontal layer ACT may be coupled to the vertical conductive line BL, and a second side of the horizontal layer ACT may be coupled to the data storage element CAP. The data storage element CAP may include a first electrode SN, a dielectric layer DE, and a second electrode PN. The second electrodes PN of the data storage elements CAP may be merged to be coupled to the common plate PL. The discrete contact node SNC may be disposed between the horizontal layer ACT and the first electrode SN, and the ohmic contact layer SC may be disposed between the discrete contact node SNC and the first electrode SN. A shared contact node BLC may be disposed between the vertical conductive line BL and the horizontal layer ACT. The edge portions WLE of the horizontal conductive lines WL1 and WL2 may have a stepped structure or a reverse stepped structure, and may include pads WLP. The pads WLP may be disposed between an edge portion of the first horizontal line G1 and an edge portion of the second horizontal line G2. In each of the horizontal conductive lines WL1 and WL2, the first and second horizontal lines G1 and G2 may be electrically connected by the pad WLP. In the memory cell array MCA of FIG. 25, after the edge portions WLE of the horizontal conductive lines WL1 and WL2 are formed to have a stepped structure, the memory cell array MCA may be formed to be inverted such that the edge portions WLE of the horizontal conductive lines WL1 and WL2 form a reverse stepped structure.

A bonding structure WBS may be disposed between the peripheral circuit portion PERI and the memory cell array MCA. The bonding structure WBS may include first bonding pads BP1 and second bonding pads BP2. The memory cell array MCA and the peripheral circuit portion PERI may be coupled to each other by metal-to-metal bonding or hybrid bonding. For example, they may be coupled to each other through the first bonding pads BP1 and the second bonding pads BP2. Metal-to-metal bonding refers to direct bonding between the first bonding pads BP1 and the second bonding pads BP2, and hybrid bonding refers to a combination of metal-to-metal bonding and dielectric bonding. The first and second bonding pads BP1 and BP2 may include a metal material.

Referring back to FIG. 25, a vertical conductive line BL and a common plate PL of the memory cell array MCA may be coupled to the first bonding pads BP1, respectively. The edge portions of the horizontal conductive lines WL1 and WL2 may be coupled to the first bonding pad BP1 through contact plugs WC, respectively.

The peripheral circuit portion PERI may include a plurality of control circuits PTR and a plurality of interconnections ML formed over the substrate SUB. For example, the control circuits PTR of the peripheral circuit portion PERI may include a sense amplifier, a sub-word line driver, and a common plate control circuit. The sense amplifier may be coupled to the vertical conductive line BL through the interconnection ML. The sub-word line driver may be coupled to the horizontal conductive lines WL1 and WL2 through the interconnection ML. The common plate control circuit may be coupled to the common plate PL through the interconnection ML. The second bonding pads BP2 may be coupled to the control circuits PTR through the interconnections ML.

The vertical conductive line BL, the data storage elements CAP, and the horizontal conductive lines WL1 and WL2 of the memory cell array MCA may be electrically connected to the control circuits PTR of the peripheral circuit portion PERI through the bonding structure WBS.

According to another embodiment of the present invention, the semiconductor device 400 may have a POC (Peripheral-Over-Cell) structure. The POC structure refers to a structure in which the peripheral circuit portion PERI is disposed over the memory cell array MCA.

According to an embodiment of the present invention, a doped region of a semiconductor device having a three-dimensional structure may be formed by lateral diffusion from a contact node.

According to an embodiment of the present invention, contact resistance of the semiconductor device may be reduced by increasing the contact area between a contact node and an ohmic contact layer.

While the present invention has been described with respect to specific embodiments, it will be apparent to those skilled in the art that various changes and modifications may be made without departing from the spirit and scope of the invention as defined in the following claims.

What is claimed is:

1. A semiconductor device, comprising:
a lower structure;
a horizontal layer extending in a direction parallel to a surface of the lower structure over the lower structure, and including a first end and a second end;
a discrete contact node coupled to the first end of the horizontal layer and extending in a direction perpendicular to the surface of the lower structure, the discrete contact node including a first impurity; and
a doped region in the horizontal layer including the first impurity which is diffused from the discrete contact node.

2. The semiconductor device of claim 1, wherein a vertical thickness of the discrete contact node is greater than a vertical thickness of the horizontal layer.

3. The semiconductor device of claim 1, wherein the discrete contact node, the doped region, and the horizontal layer include the same semiconductor material.

4. The semiconductor device of claim 1, wherein the discrete contact node includes a doped semiconductor material.

5. The semiconductor device of claim 1, wherein the discrete contact node includes doped polysilicon or a doped epitaxial silicon layer.

6. The semiconductor device of claim 1, wherein the horizontal layer includes:
monocrystalline silicon, polysilicon, germanium, silicon-germanium or IGZO (Indium Gallium Zinc Oxide).

7. The semiconductor device of claim 1, further comprising:
a shared contact node coupled to the second end of the horizontal layer and including a second impurity; and
a laterally diffused doped region in the horizontal layer including the second impurity which is diffused from the shared contact node.

8. The semiconductor device of claim 7, wherein the shared contact node includes doped polysilicon.

9. The semiconductor device of claim 1, wherein the discrete contact node includes a vertical sidewall structure, a shaving structure, or a ball structure.

10. A semiconductor device, comprising:
- a vertical conductive line extending in a first direction perpendicular to a lower structure over the lower structure;
- a horizontal layer extending in a second direction parallel to the lower structure and including a first end coupled to the vertical conductive line and a second end laterally confronting the first end;
- a discrete contact node coupled to the second end of the horizontal layer and including a first impurity;
- a doped region in the horizontal layer including the first impurity which is diffused from the discrete contact node;
- a horizontal conductive line extending in a third direction crossing the horizontal layer over the horizontal layer; and
- a data storage element coupled to the discrete contact node.

11. The semiconductor device of claim 10, wherein a vertical thickness of the discrete contact node in the first direction is greater than a vertical thickness of the horizontal layer in the first direction.

12. The semiconductor device of claim 10, wherein the discrete contact node includes doped polysilicon or a doped epitaxial silicon layer.

13. The semiconductor device of claim 10, wherein the horizontal layer includes: monocrystalline silicon, polysilicon, germanium, silicon-germanium, or IGZO (Indium Gallium Zinc Oxide).

14. The semiconductor device of claim 10, further comprising:
- a shared contact node disposed between the first end of the horizontal layer and the vertical conductive line and including a second impurity; and
- a laterally diffused doped region in the horizontal layer including the second impurity which is diffused from the shared contact node.

15. The semiconductor device of claim 14, wherein the shared contact node includes doped polysilicon.

16. The semiconductor device of claim 10, further comprising:
- an ohmic contact layer between the data storage element and the discrete contact node.

17. The semiconductor device of claim 10, wherein the data storage element includes a capacitor.

18. The semiconductor device of claim 10, wherein the horizontal conductive line includes:
- a double line structure including a pair of conductive lines facing vertically in the first direction with the horizontal layer interposed therebetween.

19. The semiconductor device of claim 10, further comprising:
- cell isolation layers disposed in the first direction over the lower structure,
- wherein the horizontal conductive line and the horizontal layer are disposed between the cell isolation layers.

20. The semiconductor device of claim 10, wherein the discrete contact node includes a vertical sidewall structure, a shaving structure, or a ball structure.

* * * * *